United States Patent [19]

Yamagishi

[11] 4,405,692

[45] Sep. 20, 1983

[54] MOISTURE-PROTECTED ALKALI HALIDE INFRARED WINDOWS

[75] Inventor: Frederick G. Yamagishi, Newbury Park, Calif.

[73] Assignee: Hughes Aircraft Company, El Segundo, Calif.

[21] Appl. No.: 327,385

[22] Filed: Dec. 4, 1981

[51] Int. Cl.³ .................. B32B 27/28; B32B 27/06; B05D 3/06; G02B 1/10

[52] U.S. Cl. ...................... 428/696; 350/16; 427/41; 427/160

[58] Field of Search ............... 427/160, 41; 428/696; 350/1.6

[56] References Cited

U.S. PATENT DOCUMENTS 4,269,896  5/1981  Yamagishi ................ 427/160 X

OTHER PUBLICATIONS

Tibbitt et al., "IR Laser Window Coating by Plasma Polymerized Hydrocarbons", Proc. Fifth Conf. on Infrared Laser Window Materials, USAF Mat. Lab. Spec. Rep., Wright Patterson AFB (1976) p. 206.

*Primary Examiner*—James R. Hoffman
*Attorney, Agent, or Firm*—W. J. Bethurum; A. W. Karambelas

[57] ABSTRACT

Alkali halide crystals are passivated by a chemical surfactant and overcoated with a plasma polymerized saturated hydrocarbon film to render them suitable for use as optical elements exposed to high humidity and abrasive environmental conditions. These crystals are continuously transmissive to light in the IR.

17 Claims, No Drawings

MOISTURE-PROTECTED ALKALI HALIDE INFRARED WINDOWS

TECHNICAL FIELD

This invention relates, generally, to the field of infrared (IR) detector systems and, more particularly, to the use of alkali halide crystals as optical elements in IR devices.

CROSS-REFERENCE TO RELATED APPLICATIONS

This application is related to U.S. application Ser. No. 088,269 filed Oct. 25, 1979 by Applicant herein. In U.S. application Ser. No. 088,269, plasma polymerized alkane films are disclosed as protective coatings for germanium and zinc sulfide crystals. The crystal combination of U.S. application Ser. No. 088,269 differs structurally from that of the present invention. Both applications are commonly assigned to Hughes Aircraft Company of Culver City, Calif.

BACKGROUND OF THE INVENTION

1. Field of the Invention

This invention is concerned with the provision of protective coatings for alkali halide crystals intended for use in IR detector systems. Alkali halides are attractive materials for use as windows and optical elements in IR detector and laser systems, particularly because of their high transmissivity in the far-IR (8- to 12-micrometer ($\mu$m) region). These compounds, however, are fragile and are sensitive to moisture. Exposing polished surfaces of these halides to high humidity causes the optical qualities of the widow to deteriorate rapidly, ultimately degrading the entire system in which they are employed. The short lifetimes of alkali halides under humid conditions require that moisture-damaged elements be regularly replaced. Aside from the inconvenience and the diminished military reliability caused by the above conditions, the need to constantly replace these elements would greatly increase the cost of these systems. Consequently, there is a need for a moisture-protective coating that would extend the lifetime of alkali halide optical components in uncontrolled environments. Although alkali halide elements may be used in enclosed systems under partially controlled environments, protective coatings are of particular importance when the systems are opened to uncontrolled (i.e., high humidity) conditions during maintenance operations.

2. Description of the Prior Art

Previous attempts to prepare moisture-protective coatings for alkali halide windows have met with only partial success. Young (P. A. Young, Thin Solid Films 6, 423 (1970)) showed that vacuum-evaporated $As_2S_3$, which was deposited as a vitreous film, protected NaCl for 7.5 hr at 100% relative humidity (RH). The degree of protection increased as the thickness increased. Films of $BaF_2$ and $MgF_2$ did not prevent damage to the alkali halide crystals because the growth of these films occured through the coalescing of crystallites which promoted porosity through voids. Damage to the surface always occurred at scratches on the underlying surface caused by mechanical polishing. Similar results were obtained by Hopkins et al. (R. H. Hopkins, R. A. Hoffman, and W. E. Kramer, Appl. Opt. 14, 2631 (1975)) who thermally evaporated $CaF_2$ on mechanically polished NaCl. This afforded protection for 24 hr at 95% RH (27° to 50° C.) after which the film failed by localized moisture penetration along fine cracks in the film.

Organic polymers would appear to be excellent candidates for moisture-protective coatings for alkali halide infrared windows. However, there are problems to be overcome in order to realize the full potential of these materials. For example, several polymers are known to be hydrophobic, but many contain functional groups that absorb in the far-IR. Linear hydrocarbon polymers, such as polyethylene, have second order absorption in the far-IR that preclude their being used. Also, thin polymer films are known to be porous. Hopkins et al. (supra) sputter-deposited both polytetrafluoroethylene and fluorinated polyethylenepropylene onto NaCl. These films protected the window from moisture damage in 95% RH for ~72 hr before moisture permeated the film, dissolving the underlying surface.

Many of the problems discussed above can be minimized or alleviated by depositing the polymer in a glow discharge. This process is called plasma polymerization (M. Millard, in "Techniques and Applications of Plasma Chemistry", ed. J. R. Hollahan and A. T. Bell, John Wiley and Sons, New York, N.Y., 1974, Chapter 5). The first example of the utility of plasma-polymerized films as moisture barriers for alkali halides was reported by Hollahan, Wydeven, and Johnson (J. R. Hollahan, T. Wydeven, and C. C. Johnson, Applied Optics 13, 1844 (1974)). Films prepared from the monomers chlorotrifluoroethylene and tetrafluoroethylene (TFE) were deposited on CsI and NaCl, respectively, in a bell jar glow discharge reactor. Plasma-polymerized TFE protected NaCl from damage by 88.8% RH for 117 hr, at which time the testing was arbitrarily stopped. However, these films cannot be used in the far-IR since the C-F bond absorbs strongly at ~8 $\mu$m.

The closest prior art known by Applicant is disclosed by Tibbitt, Bell and Shen (J. M. Tibbitt, A. T. Bell, and M. Shen, Proceedings of the Fifth Conference on Infrared Laser Window Materials, ed. by C. R. Andrews and C. L. Strecker, U.S. Air Force Materials Laboratory Special Report, Wright-Patterson AFB, Ohio (1976), p. 206), where it is reported that plasma-polymerized ethane (PPE) showed ~0.1 as much absorptance in the 8 to 12 $\mu$m region as did polyethylene prepared by free-radical polymerization. The PPE film showed none of the absorption bands characteristic of carbon-carbon double bonds, and there was no change in the IR spectrum after a coated NaCl window was allowed to stand in air for 30 days. Dielectric loss factor measurements of the PPE-coated NaCl window suggested that there was a very low uptake of water into the polymer matrix when the film was exposed to high humidity. The PPE polymer was found to be insoluble in organic solvents, stable in acid and base, and did not degrade when heated to 300° C. (Polyethylene melts at 115° to 135° C. (F. W. Billmeyer, Jr., "Textbook of Polymer Science", Interscience, New York, N.Y., 1962, Chapter 13) depending on the density.) However, it has been the experience of Applicant herein that alkali halide crystals coated with PPE film, in a manner similar to that taught by Tibbitt et al (supra), develop moisture bubbles below the surface of the polymer coatings when exposed to high humidity environments for a prolonged period of time.

Thus, there is still a need for low cost optical elements which resist high humidity and abrasive environments as disclosed below.

SUMMARY OF THE INVENTION

It has been discovered that moisture and abrasive resistant optical elements can be prepared from alkali halide crystals which exhibit few, if any, of the disadvantages of prior art environmentally protected alkali halide crystals. In accordance with this invention, alkali halide crystals are polished and chemically etched to provide a topologically smooth surface that is then treated with a chemical surfactant to provide a passivated surface. The passivated surface is then overcoated with a polymerized saturated hydrocarbon film. The combination provides a alkali halide crystal having topologically smooth outer surfaces chemically bound to a non-infrared absorbing surfactant and overcoated with a polymerized saturated hydrocarbon protective film.

It is therefore one purpose of this invention to provide moisture and abrasion resistant optical elements.

An additional purpose of this invention is to provide alkali halide crystals which resist moisture and abrasion with little or no loss in their light transmissive characteristics in the infrared wavelength range.

An additional purpose of this invention is to provide relatively inexpensive alkali halide crystals which are suitable for use as optical elements in electro-optical devices exposed to field conditions.

A further purpose of this invention is to provide an improved method of rendering alkali halide crystals insensitive to high humidity and highly abrasive conditions.

That the above-stated purposes have been accomplished will be evident, as well as will other advantageous aspects of this invention, upon reference to the following detailed description of the invention.

DETAILED DESCRIPTION OF THE INVENTION

It has been discovered that moisture-protected and abrasion resistant infrared (IR) optical elements can be prepared from relatively inexpensive alkali halide crystals by first passivating the surfaces of the alkali halide crystals with a hydrophobic surfactant and subsequently overcoating the passivated surface with a polymerized saturated hydrocarbon film. This invention is an improvement over that described and claimed in U.S. Pat. No. 4,269,896 issued to Applicant herein for Surface Passivated Alkali Halide Infrared Windows which discloses and claims alkali halide crystals whose surfaces are free of OH ions and which are overcoated with PPE in that it accomplishes the same purposes of U.S. Pat. No. 4,269,896 in a more reproducible economical manner.

Alkali halide crystals such as the chlorides, bromides, iodides and fluorides of sodium, potassium, rubidium and cesium inherently attract moisture and contain surface hydroxyl ions (OH—) which tend to increase their surface energies and render them more susceptible to degradation. This phenomenon may be overcome by passivating the surface with a chemically bound non-IR absorbing surfactant, and secondly overcoating the passivated surface with a thin protective coating of a saturated hydrocarbon polymer. The surface hydroxyl groups of the halide crystals react with the polar end of a surfactant molecule comprising both a polar end and a nonpolar hydrophobic hydrocarbon chain, thus converting the hydrophilic hydroxyl group into a less polar oxygen-surfactant group. This method of passivating the surface of the halide crystal is particularly advantageous in that the oxygen-surfactant covalent bond linkages and the underlying alkali halide substrate are thus effectively masked from the ambient by the nonpolar end of the surfactant molecule and physically protected by the hydrocarbon polymer film. Furthermore, the once polar alkali halide surface is converted to a nonpolar surface by the presence of the hydrophobic portion of the surfactant molecule which is oriented normal to the surface. This reversal of polarity at the surface of the alkali halide crystal enhances the adhesion of the hydrocarbon film which is nonpolar. While other methods have been utilized to passivate the surface of alkali halides and thus lower the surface free energy, the elimination of surface hydrophilic groups by chemical conversion constitutes an efficient improvement over the other methods.

Surfactants found to be suitable for use in forming the optical elements of this invention include, but are not limited to, the tetrachloro-$\mu$-hydroxo-$\mu$-carboxylatodichromium (III) complexes whose structures are

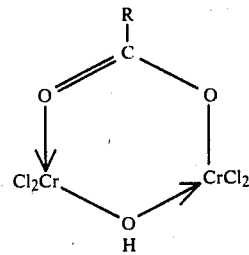

where R is the alkyl chain of a fatty acid belonging to the homologous series $CH_3(CH_2)_nCO_2H$ where n is an even integer ranging from 2 to about 14. In particular, tetrachloro-$\mu$-hydroxo-$\mu$-myristatodichromium(III) sold under the trade name "Quilon-C" by E. I. Du Pont de Nemours & Co., Inc. of Wilmington, Del., has proven to be very effective and is accordingly preferred for our purposes. However, other surfactants, sold under trade names such as "Edoran" by Mitsubishi Gas Chemical Co., Std., Tokyo, Japan, and "Scotchban FC-805" by 3M Company of St. Paul, Minn. are also effective and may be used.

Short chain acid surfactants, while believed to be operable, are not expected to be as effective as the longer chain fatty acids.

Other surfactants found to be suitable are long chain alkyl amines belonging to the homologous series $CH_3(CH_2)_nNH_2$, where n is an integer ranging from 5 to about 20. In particular, octadecylamine (n=17) has proven to be effective for our purposes.

Polymeric hydrocarbon films obtained via the plasma polymerization of gaseous alkane monomers tend to provide the most effective protective barriers for IR applications. Monomers of the formula $C_nH_{2n+2}$ where n ranges from 1 to about 5 such as methane, ethane, propane, butane and pentane are particularly suitable. Gaseous ethane is currently preferred because of the ease in which it forms high quality reproducible pinhole-free films in situ in a plasma environment.

The term plasma polymerization generally describes the use of several types of electric discharge configurations in which molecules (from gaseous monomers) are subjected to energetic electrons in the discharge or plasma. This results in the formation of intermediate free radicals, ions, and other high energy species derived from the monomer. Interaction of these species ultimately leads to polymerization. Although the detailed mechanism for the formation of plasma polymerized films is not completely understood, it is generally believed that the initial step is the adsorption of the monomer on the substrate surface. This monomer layer is then bombarded by reactive species as well as being acted upon by photochemical energy produced in the plasma. There is little discrimination shown in the position of formation for the free radicals. The net result of the propagating step is both a continuing growth of the polymer chains and a developing matrix of crosslink sites. Following termination of the plasma, there are long-lived residual free radicals trapped in the bulk and on the surface of the film. These radicals can react with atmospheric oxygen and must be quenched before the film is exposed to air so that polar, oxygen containing groups, which would be absorbing in the infrared, are not formed.

Polymers prepared via the method described above can vary in structure and molecular weight depending upon the reaction conditions. The polymer can be prepared as an oil, powder or film. In order to obtain uniform films, the reaction parameters of monomer flow rate, reaction pressure, discharge power, substrate surface preparation, and reactor configuration need to be optimized for each monomer. Thus, highly crosslinked films may be conveniently prepared. For a given set of reaction conditions, the deposition rate is typically held constant and the desired thickness is obtained by operating for a predetermined time.

The starting point in the fabrication of an optical element in accordance with this invention is the provision of a high purity alkali halide crystal. This crystal is mechanically polished to a surface roughness of $<1 \mu m$ by conventional crystal polishing methods. In order to remove defects in the crystal surfaces introduced by the mechanical polishing, the surface is chemically etched with an aqueous strong acid corresponding to the anion of the alkali halide, e.g., HCl for alkali chloride, HBr for alkali bromide, etc. The concentration of the acid may vary from about 40% to 75% concentrated acid in water. The crystal is exposed to the acid, for from about 15 to about 180 seconds. This etch is followed by a water free alcoholic rinse such as absolute ethanol or 2-propanol.

A surfactant such as that described above is dissolved in a low boiling dry solvent and spin cast onto the surface of the halide window. The polar end of the surfactant molecule chemically reacts with the surface OH groups of the halide crystal to form a linkage between the surfactant molecule and the surface hydroxide ions of the crystal lattice. When applied in this manner, the surfactant molecules are oriented such that the nonpolar hydrophobic end of the molecule is sticking up from the surface to provide a nonpolar passivated surface on the alkali halide crystal.

The passivated crystal is then preferably placed in a suitable plasma reactor to facilitate an in situ formation of a saturated hydrocarbon film by plasma polymerization. While plasma polymerization is the preferred method of applying a protective film to the passivated crystal surface, other methods may alternatively be used. Prior to initiating the plasma polymerization step of this process, the reactor is evacuated to remove ambient gases. After evacuation, a gaseous alkane reactant is introduced into the system at flow rates between 5 and 100 cubic centimeters per minute ($cm^3/min$) and at operating pressures between 0.1 and 5.0 Torr. Plasma is initiated using an RF generator operating at 13.56 MHz while simultaneously balancing the load of the plasma to the generator through an impedance matching network, as is well-known. These conditions result in the deposit of a plasma polymerized alkane film on the passivated surface of the crystal.

After a film of a desired thickness is obtained, the discharge is terminated, the flow of monomer is discontinued and the reactor evacuated. Residual free radicals caused by the plasma are quenched with an unsaturated alkene monomer such as ethylene prior to exposing the window to the ambient.

For quality control purposes, film deposition rates for a selected alkane monomer are determined by depositing a film of the alkane on glass cover slides and measuring the thickness on a Dektak FLM.

Specific applications of the above-described process are shown in the following examples:

EXAMPLES

Example 1

This example illustrates the passivation of the surface of sodium chloride. A sodium chloride sample 38.5 mm × 19.5 mm × 4 mm) was obtained from Harshaw Chemical Co. of Solon, Ohio as an unpolished window. It was mechanically polished to a surface roughness of $<1 \mu m$ and chemically etched with hydrochloric acid (conc. HCl/$H_2O$, 2:1 Vol:Vol) for 2 min, rinsed with electronic grade 2-propanol, and dried with a stream of warm air. A solution of Quilon-C in 2-ethoxyethanol (1:200 Vol:Vol) was spin-cast (Headway E C 101 Photoresist Spinner, Garland, Tex.) at 6000 rpm for 120 sec to give a thin film that had virtually no absorption in the IR (2.5 to 14 $\mu m$, Beckman IR-12 Grating Spectrophotometer, Fullerton, CA).

Example 2

Plasma polymerized ethane was deposited on the sodium chloride crystal, passivated in Example 1, under the following conditions which were found to yield high quality film in one particular reactor: Initial pressure=0.07 Torr, flow rate of ethane (Matheson Gas Products, C.P. Grade)=10 $cm^3/min$ at STP, reaction pressure=1 Torr, power=200 W (continuous mode). After 21 hours, the reaction was stopped, yielding a pale yellow film, 5.5–6.0 $\mu m$ thick. The sample was stored under 15 Torr of ethylene overnight before exposing it to air.

Example 3

After deposition of plasma polymerized ethane in Example 2, the widow was removed and placed in a hermetically sealed holder that allowed a ½ inch diameter portion of the coated window to be exposed. This assembly was placed in a sealed chamber which contained a saturated solution of cupric sulfate pentahydrate (98% relative humidity at 20° C.). The sample was removed after 248 hours. Although there were some small striations in the film, there were no bubbles or cracks in the film and there were no visible signs of surface degradation due to water dissolution.

Example 4

Single crystal potassium bromide samples (Harshaw Chemical Co., 25 mm diam × 4 mm thick) were obtained as unpolished windows. Some samples were mechanically polished, chemically etched (conc. HBr) and coated with Quilon-C as described in Example 1. Octadecylamine (ODA) was used as a passivation surfactant for other samples. This surfactant was applied to the windows as a very thin film by either dipping the windows into a saturated solution of ODA in hexane or 2-ethoxyethanol, or by spreading molten ODA on the surface of the polished windows and removing the excess with a tissue. Each of these methods deposited a thin film of ODA that had virtually no absorption in the IR (2.5 to 14 μm range). Plasma polymerized ethane was deposited on KBr crystals, which were passivated as described above, in a manner described in Example 2. After deposition of plasma polymerized ethane, the windows were hermetically sealed, as described in Example 3, and exposed to constant relative humidity (85 to 88% RH) at 25° C. (Blue M Electric Co. constant humidity chamber). Lifetimes of these passivated and protected KBr windows are shown in Table I.

TABLE I

Moisture Protection of PPE Coated KBr Flats with Surface Passivation Method at 25° C.

| Method | Thickness of PPE, μm | Relative Humidity, (%) | Lifetime,[a] Hr | Comments |
|---|---|---|---|---|
| HBr | ~5 | 88 | 3 | |
| Q/C[b] | 6.5 | 88 | 80 | 1 layer |
| Q/C | 4.8 | 88 | 50–100 | 3 layers |
| Q/C | 5.5 | 85 | 52 | Baked at 65° for 65 hr |
| Q/C | 4.0 | 88 | 18 | Baked at 129° for 17.5 hr |
| ODA[c] | ~5 | 88 | 48 | Slow salt formation over 5 days |
| ODA | 5.5 | 85 | 52 | Baked at 65° for 65 hr |
| ODA | 4.0 | 88 | 18 | Baked at 129° for 17.5 hr |

[a]Lifetime = salt deposition on the surface after drying.
[b]Q/C = Quilon-C (DuPont), diluted 1 part in 200 parts of 2-ethyoxyethanol.
[c]ODA = octadecylamine.

The data presented in Table I show that the life times of KBr flats was increased from 500 to as much as 2,700 percent by the passivation and overcoating process of this invention. The process is equally effective for use in preparing protected KCl, NaCl and NaBr crystals.

INDUSTRIAL APPLICABILITY

This invention provides protected, easy to prepare, and relatively inexpensive alkali halide crystals which transmit light in the IR wavelength ranges. The crystals of this invention may be used as laser windows or as other optical elements which are exposed to high humidity and abrasive environmental conditions.

What is claimed is:

1. An infrared optical element comprising an alkali halide crystal having topologically smooth outer surfaces chemically bound to a non-infrared absorbing surfactant and overcoated with a polymerized saturated hydrocarbon film.

2. The element of claim 1 wherein said surfactant is a carboxylatodichromium complex selected from the group whose formula is:

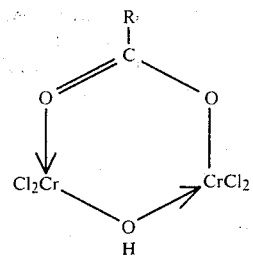

where R is the alkyl chain of a fatty acid belonging to the homologous series $CH_3(CH_2)_nCO_2H$ where n is an even integer ranging from 2 to about 14.

3. The element of claim 2 wherein said film is a plasma polymerized alkane film.

4. The element of claim 3 wherein said surfactant is tetrachloro-μ-hydroxo-μ-myristatodichromium(III) and said alkane is ethane.

5. The element of claim 4 wherein said alkali halide is NaCl.

6. The element of claim 1 wherein said film is a plasma polymerized alkane film.

7. An infrared optical element comprising an alkali halide crystal whose topological smooth surface is passivated by surfactant molecules, each molecule having a polar end and a nonpolar hydrophobic hydrocarbon chain, where said molecules are chemically bound at their polar ends to said surface by covalent bond linkages, and overcoated with a polymerized saturated hydrocarbon film.

8. The element of claim 7 where said surfactant is a carboxylatodichromium complex selected from the group whose formula is:

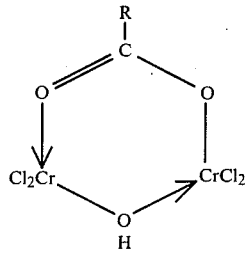

where R is the alkyl chain of a fatty acid belonging to the homologous series $CH_3(CH_2)_nCO_2H$, where n is an even integer ranging from 2 to about 14.

9. The element of claim 8 wherein said surfactant is tetrachloro-μ-hydroxo-μ-myristatodichromium(III).

10. The element of claim 9 wherein said film is an alkane of the formula $C_nH_{2n+2}$, where n ranges from 1 to about 5.

11. The element of claim 10 wherein said film is a plasma polymerized ethane film and said halide is KCl, NaCl, KBr or NaBr.

12. The element of claim 7 wherein said surfactant in a long chain amine whose structure is $CH_3(CH_3)_nNH_2$ where n ranges from 5 to about 20.

13. The element of claim 12 wherein n is 17.

14. A method for rendering an alkali halide crystal moisture and abrasive resistant comprising the steps of:
   forming a topologically smooth crystal surface by sequentially polishing and chemically etching said crystal;

applying a chemical surfactant comprised of molecules having a polar end and a nonpolar hydrophobic end to said smooth surface to thereby provide a passivated crystal surface; and subsequently forming a protective film consisting of a polymerized saturated hydrocarbon on said passivated surface thereby providing a protected passivated alkali halide crystal.

15. The method of claim 14 wherein said surfactant is a carboxylatodichromium complex of a fatty acid having a carbon chain comprising from 2 to about 14 carbon atoms.

16. The method of claim 14 wherein said film is a plasma polymerized ethane film.

17. A moisture and abrasive resistant alkali halide crystal prepared by the method of claim 14.

* * * * *